United States Patent [19]
Brunsvold et al.

[11] Patent Number: 5,338,818
[45] Date of Patent: Aug. 16, 1994

[54] SILICON CONTAINING POSITIVE RESIST FOR DUV LITHOGRAPHY

[75] Inventors: William R. Brunsvold, Poughkeepsie; Premlatha Jagannathan, Patterson; Steve S. Miura, Wappingers Falls; Melvin W. Montgomery, New Windsor; Harbans S. Sachdev, Hopewell Junction; Ratnam Sooriyakumaran, Fishkill, all of N.Y.

[73] Assignee: International Business Machines Corporation, Armonk, N.Y.

[21] Appl. No.: 943,086

[22] Filed: Sep. 10, 1992

[51] Int. Cl.$^5$ .............................. C08G 77/00
[52] U.S. Cl. ..................... 528/43; 528/10; 430/270
[58] Field of Search ........... 528/10, 43; 556/440; 430/270

[56] References Cited

U.S. PATENT DOCUMENTS

| | | | |
|---|---|---|---|
| 4,507,384 | 3/1985 | Morita | 528/43 |
| 4,544,729 | 10/1985 | Nate et al. | 528/28 |
| 4,657,843 | 4/1987 | Fukuyama et al. | 430/323 |
| 4,734,481 | 3/1988 | Steinmann | 528/43 |
| 4,745,169 | 5/1988 | Sugiyama et al. | 528/43 |
| 4,931,379 | 6/1990 | Brunsvolt et al. | 430/270 |
| 5,120,629 | 6/1992 | Bauer et al. | 430/70 |
| 5,158,854 | 10/1992 | Imamura et al. | 430/192 |

FOREIGN PATENT DOCUMENTS

| | | |
|---|---|---|
| 342496 | 11/1987 | European Pat. Off. |
| 1102450 | 3/1984 | Japan |
| 62-287242 | 12/1987 | Japan |
| 241542 | 10/1988 | Japan |

OTHER PUBLICATIONS

Sugiyama et al., "Positive Excimer Laser Resists Prepared With Aliphatic Diazoketones", Society of Plastics Eng. Conf., pp. 51-60 (Nov. 1988).

*Primary Examiner*—Ralph H. Dean
*Attorney, Agent, or Firm*—Whitham, Curtis & Whitham

[57] ABSTRACT

A method of synthesizing a silicon-containing positive resist for use as a imaging layer in DUV, x-ray, or e-beam lithography is disclosed. The resist contains arylsilsesquioxane polymers with acid sensitive pendant groups as dissolution inhibitors and a photoacid generator.

4 Claims, 1 Drawing Sheet

SILICON CONTAINING POSITIVE RESIST FOR DUV LITHOGRAPHY

BACKGROUND OF THE INVENTION

1. Field of the Invention

The present invention is generally related to a positive photoresist that can be used as the top imaging layer in a bilayer scheme or as the imaging layer in a single layer scheme, and, more particularly, to a positive photoresist for deep ultraviolet radiation (DUV), x-ray, or e-beam lithography that exhibits high sensitivity and high resolution and can be developed with metal-ion-free aqueous alkali.

2. Description of the Prior Art

The increasing density of integrated circuits has created a need for higher resolution patterning capabilities. One method of improving resolution involves using a shorter wavelength light during pattern formation. Shorter wavelengths of approximately 200–280 nm may be obtained by using a DUV source such as a Hg/Xe lamp with the appropriate filters. Additionally, KrF (248 nm) or ArF (193 nm) excimer lasers may be used as exposure sources. However, at shorter wavelengths the depth of focus of the exposure tool, which may be an excimer stepper, or step and scan tool, may be adversely affected. The depth of focus (DOF) is an expression of the range of distances from the image focal plane through which the projected image remains in subjectively acceptable focus. DOF is related to wavelength and lens numerical aperture according to the formula:

$$DOF \, \alpha \lambda/2(NA)^2$$

where $\lambda$ is the wavelength of exposing light and NA is the numerical aperture of the lens. Generally, a depth of focus of 1 to 2 $\mu m$ is required for an adequate lithographic process window, in order to accommodate variations in the thickness or height of the resist film.

In addition to using shorter wavelengths during exposure, it is also desirable to use a thinner layer of resist. However, as shown in FIG. 1, the major drawback of using a thin layer of resist 27 is that the variation of resist thickness over a diffusion step 21 on a substrate 23 and into an etched pattern 25 increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To improve dimensional control, bilevel or multilevel resist systems are often utilized. A typical bilevel system is shown in FIG. 2. A bottom resist 1 is first applied to the substrate 3 to planarize wafer topography. The bottom resist 1 is cured. A second thinner imaging top resist 5 is then applied over the bottom resist 1. The top resist 5 is soft baked and a pattern 7 formed using conventional resist exposure and development, followed by etch transfer of the top pattern through the bottom resist 1 using the top resist pattern 7 as an etch mask.

Positive resists are commonly used in bilayer or multilayer applications and are usually based on novolac resins, which are the condensation polymers of substituted phenols and formaldehyde. Positive resists containing a photosensitive material become soluble in the areas which are exposed to radiation. The developers for positive resists either contain metallic ions, typically sodium or potassium, or are classified as metal-ion-free developers, which primarily contain tetramethyl ammonium hydroxide (TMAH). The metal-ion-free developers are becoming more widely used due to the cleaner processing environment. More specifically, the silicate or borate salts of metal-ion developers can cause particulate contamination around the processing equipment when residue dries. Further, the sodium or potassium can contaminate oxide films with mobile ions.

Sugiyama et al., *Positive Excimer Laser Resists Prepared with Aliphatic Diazoketones*, Soc. Plastics Eng., Conference Proceedings 51–60 (Nov. 1988), disclose a new class of alkali-developable positive excimer laser resists. The two-component resists are designed for DUV lithography and are comprised of $\alpha$-diazoacetoacetates blended with polyhydroxybenzylsilsesquioxane (PHBS) as a matrix resin.

U.S. Pat. No. 4,745,169 discloses silicon-containing polymers for use in bilayer resist applications. The base soluble silsesquioxane polymer is synthesized by reacting trimethylsilyl iodide with polymethoxybenzyl-silsesquioxane to form aryl-o-trimethyl silyl groups. These trimethyl silyl groups are then hydrolyzed in water to form hydroxy groups. However, this reaction is not highly reproducible and often gives crosslinked polymer. Moreover, when these polymers are combined with diazonaphthoquinone-based photoactive compounds (PACs), exposure doses of $>100 \, mJ/cm^2$ at 365 nm are required to pattern the resist. Resists containing such (PACs) are too optically dense in the 200–280 nm region to be practical for DUV lithography. The optical density is greater than 0.5 for a 0.3 $\mu m$ film of 20% PAC in any polymer and the imaging dose is greater than 50 $mJ/cm^2$ in the DUV range. The optical density should be less than 0.3 or 0.4 $\mu m$ for a single layer resist film in order to provide the most vertical wall profiles. For thinner films in a bilayer system the optical density should typically be less than or equal to 0.3 for a 0.3 to 0.4 $\mu m$ film.

Japanese Patent No. JP 63-241542 uses chemical amplification in combination with dissolution inhibition to provide increased processing rates using lower exposure doses. Generally, during exposure in a non-chemically amplified system, absorption of 1 photon by the photoactive compound generates 1 molecule of a carboxylic acid. However, in a chemically amplified system, 1 molecule of a sulfonic acid will further react with acid labile groups, thereby allowing the removal of up to 1000 acid labile groups with the absorption of a single photon; this, in turn, provides an increased rate of solubilization in the exposed areas of the resist. Thus, it is possible to utilize lower exposure doses in a chemically amplified system. In the method disclosed in the Japanese patent, polysilsesquioxane is first acetylated and then carboxylic acid or hydroxyl groups are generated. Poly(t-butyldimethylsilyloxystyrene), poly(butyloxycarbonyloxystyrene) or other polymers with pendant groups that can undergo a polarity change catalyzed by strong acid must be added in a ratio of about 0.1/1 to make the polysilsesquioxane insoluble in base developers. Onium salts are used as photoacid generators. Onium salts are sometimes undesirable, however, because they have limited solubility in some solvents and can have a substantial absorbance in the 240–254 nm range.

SUMMARY OF THE INVENTION

It is therefore an object of the present invention to provide a silicon-containing positive photoresist with high sensitivity to DUV, e-beam and x-ray exposure systems and which can be developed with metal-ion-free aqueous alkali.

According to the invention, a positive silicon-containing photoresist is formulated by adding a photoacid generator to arylsilsesquioxane polymers having acid sensitive pendant groups. The polymers utilized in the present invention are synthesized by protecting the phenolic sites on the sidechains of a PHBS molecule with acid labile groups, which act as dissolution inhibitors. The acid labile groups include t-butyloxycarbonyl (BOC), secondary alkyl, substituted deactivated secondary benzyl and 1-(deactivated heterocyclic)secondary alkyl pendant groups.

In a preferred embodiment of the invention, trifluoromethylsulfonyloxybicyclo[2,2,1]-hept-5-ene-2,3-dicarboximide (MDT) is utilized as the photoacid generator. The synthesis of MDT is described in U.S. patent application Ser. No. 07/322,848, filed on Mar. 14, 1989, which is herein incorporated by reference. Upon irradiation, MDT produces a strong acid which deblocks the acid labile pendant groups during a subsequent post bake step to render exposed areas of the resist soluble to aqueous alkali.

In another embodiment of the invention, various compounds are added to the resist to sensitize the photoacid generator to exposure at longer wavelengths. Suitable compounds for sensitizing the photoacid generator to exposure in the 350–600 nm range are anthracene, 9-anthracene methanol, 1,4-dimethoxy-anthracene, 9,10-dimethoxyanthracene, 9,10-dimethylanthracene, and 9-phenoxymethylanthracene, 9,10-bis(n-butylethynyl)anthracene, 9,10-bis(n-trimethylsilylethynyl)anthracene, and 1,8-dimethoxy-9,10-bis(-phenylethynyl)anthracene.

In still another embodiment of the invention, the acid sensitive polymers utilized in the resist formulation are combined with a novolac resin to improve their thermal stability.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
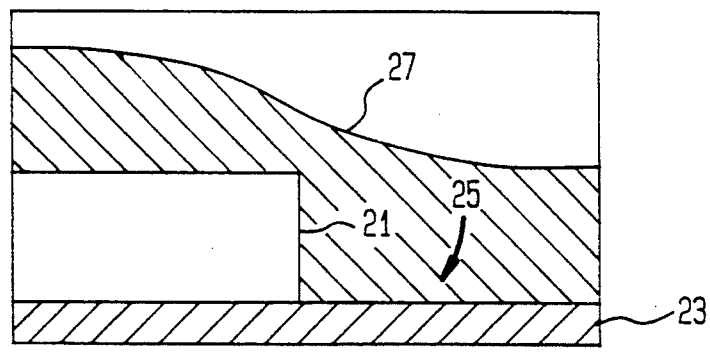
FIG. 1 is a cross-sectional side view of a single layer resist system.

The positive photoresist of the present invention comprises an acid sensitive polymer with approximately 30% acid sensitive pendant groups and a photoacid generator. The acid sensitive polymer is derived from an arylsilsesquioxane polymer, PHBS. PHBS may be synthesized by various prior art processes such as the method disclosed in U.S. Pat. No. 4,745,169. However, PHBS is most preferably synthesized in accordance with the method disclosed by Hefferon et al., *Method for Synthesis of Alkali Soluble Silsesquioxane Polymers*, IBM Technical Disclosure Bulletin, 34, (4B), 313 (September, 1991), in which polymethoxybenzyl silsesquioxane is reacted with boron tribromide to replace the methyl group with hydrogen. In a preferred embodiment of the invention, the acid sensitive pendant groups are BOC groups and the photoacid generator is MDT. The PHBS-BOC polymer is synthesized by reacting PHBS with di-t-butyldicarbonate as shown below:

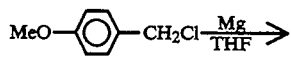

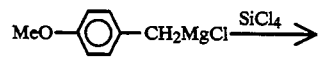

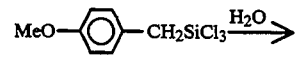

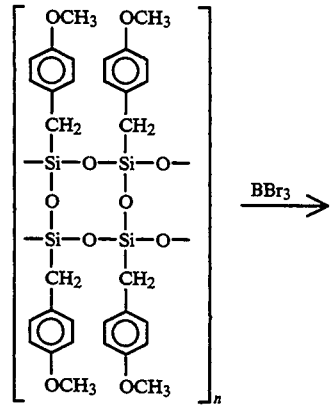

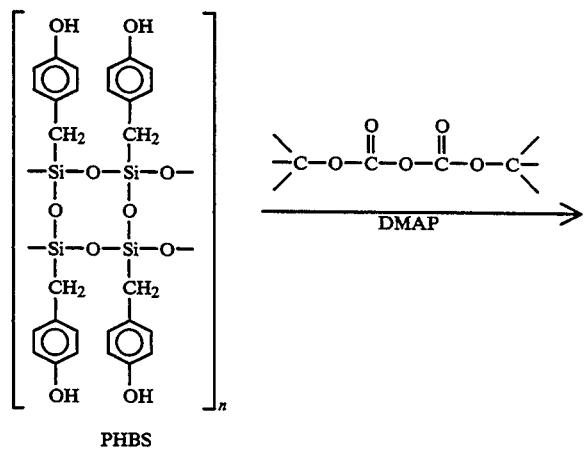

PHBS

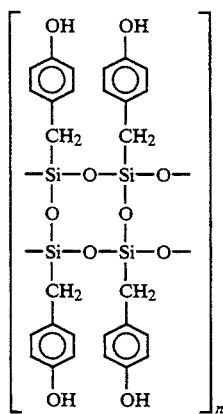

PHBS-BOC wherein the R constituents may be hydrogen or BOC pendant groups. In another embodiment, the R constituents have the formula:

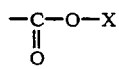

where the X constituents may be secondary alkyl, substituted deactivated secondary benzyl and 1-(deactivated heterocyclic)secondary alkyl pendant groups. Suitable secondary alkyl, substituted deactivated secondary benzyl and 1-(deactivated heterocylic)secondary alkyl pendant groups are disclosed in U.S. Pat. No. 4,931,379, which is herein incorporated by reference. The ratios of BOC groups to free OH groups is between 15:85 and 50:50 and, most preferably, between 25:75 and 30:70. The number of repeat units n is at least 3 and, typically, n=3 to 8 and molecular weight is approximately 3000 g/mole.

During exposure to UV light in the range of 193 to 260 nm, x-rays or e-beams, MDT generates trifluoromethane sulfonic acid ($CF_3SO_3H$), a strong acid which deblocks the acid labile pendant groups during a subsequent post exposure bake, as shown by the following reaction:

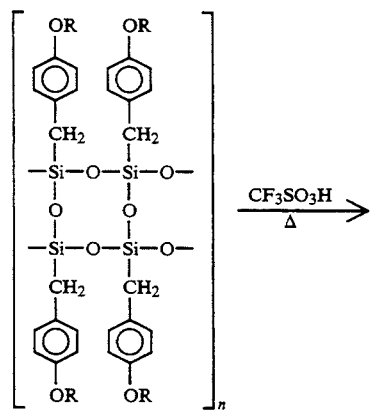

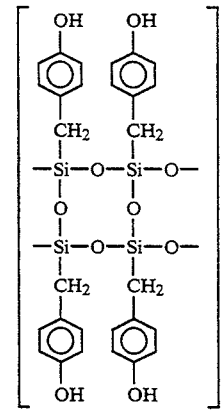 + $CO_2$ + $C_4H_8$

This renders the areas which were exposed to radiation soluble to aqueous alkali. Alternatively, other sulfonic acid generators such as sulfonate esters of dicarboximides, aryl sulfonates and onium salts may be used to deblock the PHBS-BOC. However, MDT is preferred because of its high solubility in casting solvents, low absorbance in the DUV region and its ability to generate triflic acid, which provides higher sensitivity than other sulfonic acids.

In a preferred embodiment of the invention, the positive photoresist polymer is synthesized as follows: 7.9576 grams (36.5 m moles) of di-t-butyldicarbonate and 0.2 grams of 4-dimethylaminopyridine (DMAP) are dissolved in 200 milliliters of acetone and added to a 3-neck round bottom flask, along with 20 grams (62.9 m moles) of PHBS. The solution is stirred at room temperature under an argon atmosphere. After 5 to 6 hours of stirring, an excess of deionized water, about 3 times the volume of acetone, is added to the flask to cause the polymer to precipitate. The water-acetone mixture is then decanted and the polymer precipitate is dissolved in about 100 milliliters of methanol. This solution is reserved. 1 gram of Amberlite IRP-64, a weakly acidic resin, is then added to a beaker along with enough glacial acetic acid to wet the resin completely. The solution is allowed to stand for 1 or 2 minutes before adding 100 ml of deionized water. Addition of the IRP-64 ensures stability of the polymer in the resist solution by removing any basic impurities, such as DMAP, that could be carried through the synthesis. The resin is then allowed to settle to the bottom of the beaker and the acetic acid/water mixture is decanted. Additional water is added to the beaker several times and decanted to remove all of the acetic acid from the resin. The resin is then washed with methanol several times and the methanol is decanted. The resin is added to the reserved polymer-containing solution and the mixture is stirred for 10 minutes. The mixture is filtered and the solvent is removed by rotary evaporation. The resulting polymer is dried under vacuum, and has a ratio of BOC groups to OH groups of 29:71.

A polymer having a ratio of BOC groups to OH groups of 50:50 may be prepared by substituting 0.5 molar equivalents of di-t-butyldicarbonate in the above described synthetic procedure. Similarly, nearly complete substitution of the polymeric OH groups by BOC groups may be accomplished in the presence of excess di-t-butyldicarbonate.

Figure 2A:
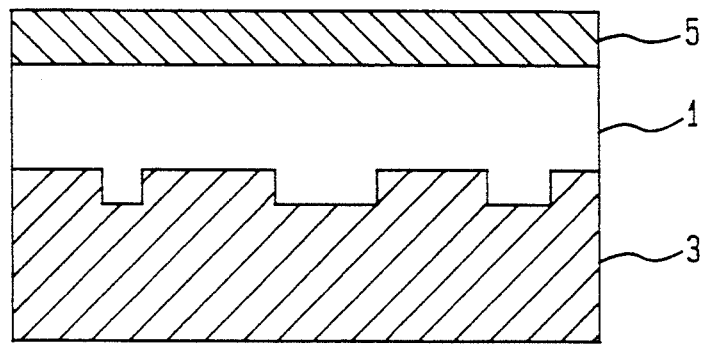
FIG. 2 are sequential cross-sectional side views in a process of applying a bilevel resist to a substrate.
Figure 2B:
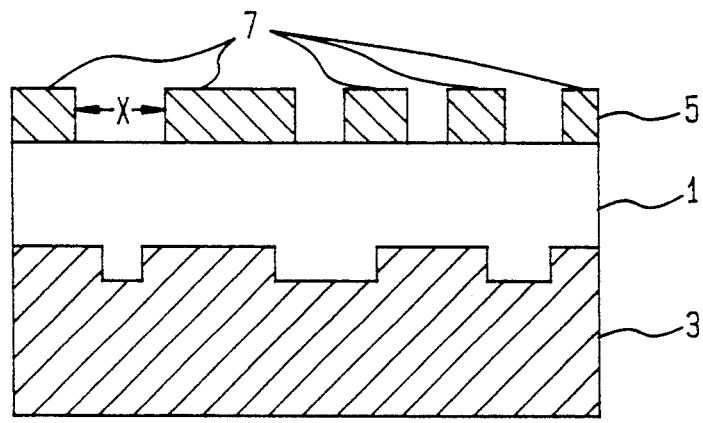
Figure 2C:
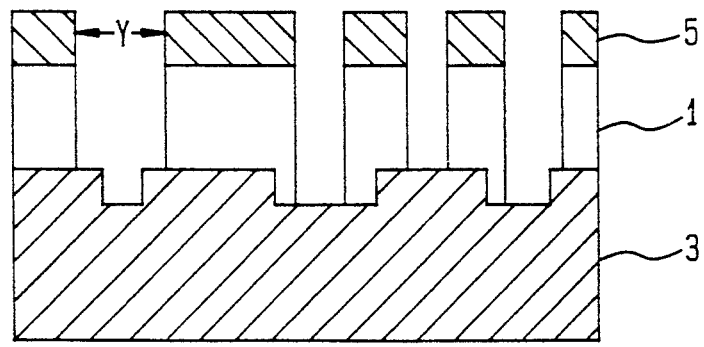

The PHBS-BOC polymer may be combined in a solution with a photoacid generator to provide an aqueous base developable silicon-containing resist that exhibits the high sensitivity required to satisfy step and scan tool throughput requirements. The resulting resist film contains approximately 14% silicon which provides good $O_2$ RIE resistance. Clean images down to a 0.35 μm feature size have been resolved and transferred into a 1 μm underlayer by $O_2$ RIE. Moreover, images down to 0.25 μm have been resolved at 7 μC/cm² at 50 KeV using e-beam lithography. Yet another indication of the high resolution provided by the resist is the contrast, which is greater than 9. Contrast is a measure of the radiation in the area of intended exposure $I_1$ to that in the area of intended unexposure $I_0$, where contrast = $(I_1 - I_0)/(I_1 + I_0)$. The higher the contrast, the better the resolution. By comparison, the contrast for traditional resists is 2–4, while for the amplified resists it is about 5–10. Less than 200 Å of thinning is observed in the unexposed areas of the resist. The amount of thinning is kept below 200Å to prevent rounded corners in the resist which would adversely affect etch bias. Bias refers to the difference in feature size of the post etch dimension Y versus the pre-etch dimension X (see FIG. 2). The etch ratio using PHBS-BOC in combination with MDT as the photoacid generator is 1:23, which indicates that pattern transfer to thicker underlayers is readily accomplished. The etch ratio compares the rate at which silicon will be eroded versus the rate at which the underlayer is eroded and is a measure of the ability to transfer a pattern to the underlayers.

In a preferred method of forming a bilevel resist, a 0.6–1 μm underlayer of a diazonaphthoquinone-containing photoactive compound in a novolac resin matrix is coated on a substrate by spin-applying. These compositions are commercially available from sources such as Shipley and Hoechst-Celanese. The coated photoresist film is baked at 90° C. for 1 minute to remove the solvent and then hard baked at 230° C. for 2 minutes. Baking above 200° C. crosslinks the compound and renders it inert to the application of resist coatings above it. A 0.2–0.6 μm, most typically 0.3 μm, thick layer of the resist material synthesized in accordance with the present invention is then coated over the underlayer of hard baked resist by similar techniques. Preferably, the resist is applied by using a solution containing 15% solids in a propylene glycol monomethyl ether acetate (PMA) solution, where MDT comprises 6–10% of total solids and PHBS-BOC is 90–94% of total solids. Most preferably, the MDT comprises 8% and PHBS-BOC comprises 92% of total solids. The resulting resist has a very high photospeed of about 1 mJ when untreated, which could result in overexposure of the resist if the speed is too fast for the exposure tool. Consequently, the resist must be treated with a second Amberlite ion exchange resin, IRN 78, which is strongly basic, to slow the photospeed down to 5 to 20 mJ. This is achieved by adding 1 part of the IRN 78 to 10 parts resist and stirring the solution between 3 and 24 hours. The resin scavenges any acid impurities that may be present and may remove low molecular weight components from the polymer as well which slows the dissolution rate in aqueous base. Alternatively, acid labile groups such as secondary alkyl, substituted deactivated secondary benzyl and 1-(deactivated heterocyclic)secondary alkyl pendant groups may be used in the synthesis of the positive resists since they provide a slower photospeed.

After the resist is applied to the underlayer, it is baked at 90° C. for one minute. The resist is then patterned by exposure using a 6–60 mJ/cm² dose on a Canon Excimer stepper (NA 0.37, 248 nm) followed by a 60–90 second post-exposure bake at 70°–90° C. The film is then developed in 0.21N tetramethyl ammonium hydroxide (TMAH) for about 1 minute to form an etch pattern. Finally, the pattern is transferred to the underlayer with an oxygen reactive ion etch process.

In another embodiment, PHBS-BOC may be coated on a substrate without an underlayer. A 1 μm thick film of the PHBS-BOC composition described above was processed in the same manner as outlined above to give 0.45 μm line and space features.

In another embodiment of the invention, the positive photoresist polymer is blended with novolac resin to improve its thermal stability. A $T_g$ above 100° C. is often desirable in semiconductor processing since temperatures near 100° C. may be reached during etch transfer. Because the glass transition temperature $(T_g)$ of PHBS-BOC polymer, for example, is about 95° C., the processing of imaged PHBS-BOC wafers above that temperature is precluded. Thus, it is advantageous to generate a resist having a $T_g \geq 100°$ C. by blending two parts PHBS-BOC resist with one part of a 25% novolac resin (mw=7000 from 50:50 meta/para cresol solution) in PMA. Novolac resins with a $T_g$ in the range of 100° to 125° C. are commercially available from sources such as Hoechst Celanese, Shipley and Kodak. The resulting resist can be coated on an underlayer or as a single layer resist on a silicon wafer, then exposed and developed as before to give a resolution of 0.5 μm or better. The silicon content is about 10%, which is still sufficient for etch resistance during pattern transfer. Those skilled in the art will understand that other high $T_g$ polymers which are compatible with PHBS-BOC, such as poly (co-(methylmethacyrlate)-(methacrylic acid)-(tert-butyl methacrylate)) may also be added to the polymer blends in additional, alternative embodiments.

In yet another embodiment of the invention, various compounds may be added to sensitize the photoacid generators to exposures at longer wavelengths; i.e., in the 350–600 nm range, which includes i-line (365 nm), h-line (405 nm) and g-line (436 nm) exposures. Such compounds are disclosed in U.S. patent application Ser. No. 07/761,183, filed on Sep. 17, 1991, which is a continuation-in-part of U.S. patent application Ser. No. 07/322,848, filed on Mar. 14, 1989, and include anthracene, 9-anthracene methanol, 1,4-dimethoxyanthracene, 9,10-dimethoxyanthracene, 9,10-dimethylanthracene, and 9-phenoxymethylanthracene for 365 nm sensitization, 9,10-bis(n-butylethynyl)anthracene and 9,10-bis(n-trimethylsilylethynyl)anthracene for 405 and 436 nm sources, and 1,8-dimethoxy-9,10-bis(phenylethynyl)anthracene for 488 and 514 nm sensitization. Resists which are suitable for patterning at wavelengths in this range are often desired for purposes of compatibility with certain exposure tools.

In another embodiment of the invention, the photoresist may be imaged by patternwise or flood exposure to e-beam or x-ray radiation.

The skilled artisan will understand that polyhydroxyphenyl silsesquioxane (PHPS) comprising polymers may be easily substituted for the PHBS polymers disclosed herein, and such PHPS compositions are within the scope of the present invention.

While the invention has been described in terms of several preferred embodiments in which the resist is applied in a bilayer system, those skilled in the art will recognize that the resist may also be utilized in single or multilayer systems and that the invention can be practiced with further modifications within the spirit and scope of the appended claims.

Having thus described our invention, what we claim as new and desire to secure by Letters Patent is as follows:

1. An acid sensitive polymer having the formula:

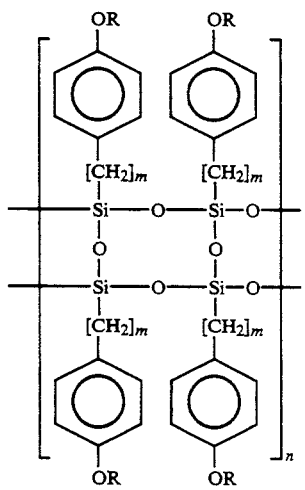

wherein m is 0 or 1, and wherein n is at least 3, and wherein the R constituents are either hydrogen groups or X constituent groups which have the formula:

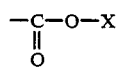

wherein the X constituents are selected form the group consisting of secondary alkyl, t-butyl, substituted deactivated secondary benzyl, and 1-(deactivated heterocyclic) secondary alkyl pendant groups, said X constituent groups and said hydrogen groups being present at a X constituent:hydrogen ratio ranging from 15:85 to 50:50.

2. An acid sensitive polymer as recited in claim 1 wherein said X constituent:hydrogen ratio ranges between 25:75 and 30:70.

3. An acid sensitive polymer having the formula:

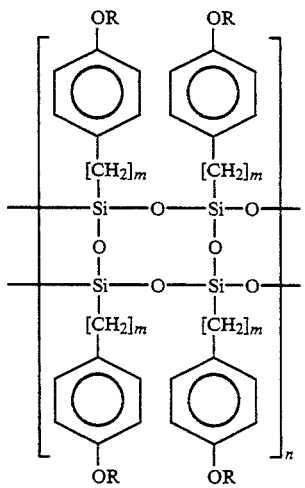

wherein m is 0 or 1, and wherein n is at least 3, and wherein the R constituents are either hydrogen groups or t-butyloxycarbonyl groups present at a ratio of t-butyloxycarbonyl:hydrogen ranging from 15:85 to 50:50.

4. An acid sensitive polymer as recited in claim 3 wherein said t-butyloxycarbonyl:hydrogen ratio ranges between 25:75 and 30:70.

* * * * *